United States Patent [19]

Van Uijen

[11] Patent Number: 4,691,162
[45] Date of Patent: Sep. 1, 1987

[54] METHOD AND DEVICE FOR NMR SPECTROSCOPY

[75] Inventor: Cornelis M. J. Van Uijen, Eindhoven, Netherlands

[73] Assignee: U.S. Philips Corporation, New York, N.Y.

[21] Appl. No.: 726,213

[22] Filed: Apr. 23, 1985

Related U.S. Application Data

[63] Continuation-in-part of Ser. No. 447,841, Dec. 8, 1982, Pat. No. 4,527,124.

[30] Foreign Application Priority Data

Sep. 10, 1982 [NL] Netherlands .......................... 8203519

[51] Int. Cl.[4] ........................................... G01R 33/20
[52] U.S. Cl. ..................................... 324/309; 324/311
[58] Field of Search ............... 324/300, 307, 309, 310, 324/311, 313, 318, 322

[56] References Cited

U.S. PATENT DOCUMENTS

| | | | |
|---|---|---|---|
| 4,290,019 | 9/1981 | Hutchison | 324/311 |
| 4,451,788 | 5/1984 | Edelstein | 324/309 |
| 4,516,075 | 5/1985 | Moran | 324/309 |

Primary Examiner—Michael J. Tokar
Attorney, Agent, or Firm—Robert T. Mayer; Algy Tamoshunas

[57] ABSTRACT

The invention proposes a method and a device in which resonance signals (generated for NMR imaging) are sampled in the presence of a static or semi-static and time modulated gradient magnetic field with the gradient direction of the fields applied being mutually perpendicular. The resonance signals are conditioned prior to the start of sampling. The sampled signals are associated with spatial frequencies (i.e. points in a spatial frequency space $(k_x, k_y)$ which is the (2-D) Fourier transform of the actual (s, y) space), which are determined by the applied gradient fields. The static or semi-static gradient field always produces an increase (for example, in $k_x$), while the time modulated gradient field always produces an image frequency which lies between two limits ($k_y$ and $k_y + k_y$). Consequently, the invention enables determination of NMR spectroscopy data in an entire band in the $(k_x, k_y)$ space. The method and device according to the invention are also applicable for 3-D imaging of 3-D objects.

23 Claims, 9 Drawing Figures

METHOD AND DEVICE FOR NMR SPECTROSCOPY

This application is a continuation-in-part application of U.S. application Ser. No. 447,841, filed Dec. 8, 1982, which has issued as U.S. Pat. No. 4,527,124 and the benefit for all common subject matter is hereby claimed.

The invention relates to a method of determining a nuclear magnetization distribution spectra or NMR spectroscopy in a part of a body which is situated in a stationary, homogeneous magnetic field which is generated in a first direction comprising, the steps of (a) a high-frequency electromagnetic pulse being generated in order to cause a precessional motion of the magnetization of nuclei in the body around the first field direction to generate a resonance signal; (b) after which at least one gradient magnetic field is applied during a preparation period; (c) after which a further gradient field is applied for a measuring period which is divided into a number of equally large sampling intervals for the periodic extraction of a number of (n) sampled signals from the resonance signal (FID-signal); (d) after which, each time after a waiting period, the steps (a), (b) and (c) are repeated a number of times (n'), so that the integral of the intensity of at least one gradient field over the preparation period each time has a different value in order to obtain a group of sampled signals such that, after Fourier transformation thereof, an image of the distribution of the induced nuclear magnetization is determined.

The invention further relates to a method of determining a nuclear magnetization spectra distribution in a part of a body which is situated in a stationary, homogeneous magnetic field which is generated in a first direction, comprising the steps of (a) a high-frequency electromagnetic pulse being generated in order to cause a precessional motion of the magnetization of nuclei in the body around the first field direction to generate a resonance signal; (b) after which at least one gradient magnetic field is applied during a preparation period; (c) after which during a measuring period a number of (n) sampled signals are taken from the resonance signal with the measuring period being divided into a number of equally large sampling intervals for the periodic extraction of a number of (n) sampled signals; (d) after which, each time after a waiting period, the steps (a), (b) and (c) are repeated a number of times (n') with the integral of the intensity of at least one gradient field over the preparation period each time having a different value in order to obtain a group of sampled signals such that, after Fourier transformation thereof, an image of the distribution of the induced nuclear magnetization spectra is determined.

The invention also relates to a device for determining the nuclear magnetization spectra distribution in a part of a body, comprising:

(a) means for generating a stationary homogeneous magnetic field, (b) means for generating high-frequency electromagnetic radiation, (c) means for generating at least one gradient magnetic field, (d) sampling means for sampling a resonance signal generated by means of the means mentioned in sub (a) and (b), after conditioning the resonance signal with at least one gradient field generated by the means mentioned in sub (c), (e) processing means for processing the signals supplied by the sampling means, and (f) control means for controlling at least the means mentioned in sub (b) to sub (e) for generating, conditioning, sampling and processing a number of resonance signals with each resonance signal being conditioned each time during a preparation period and with the control means supplying the means mentioned in sub (c) with control signals for the adjustment of the intensity and/or duration of at least one gradient magnetic field, and further with the integral of the intensity over the duration of at least one gradient magnetic field being different after each waiting period.

Such a method (also referred to as Fourier zeugmatography) and device are known from German Offenlegungschrift No. 26.11.497. According to such a method, a body to be examined is subjected to a strong, stationary, homogeneous magnetic field $B_o$ whose field direction coincides with, for example, the z-axis of a Cartesian coordinate system (x, y, z). The stationary magnetic field $B_o$ causes a slight polarization of the nuclear spins present in the body and enables a precessional motion of nuclear spins around the direction of the magnetic field Bo. After application of the magnetic field Bo, a preferably 90° pulse of a high-frequency electromagnetic radiation is generated (with an angular frequency $\omega = \gamma \cdot B_o$, in which $\gamma$ is the gyromagnetic ratio and Bo is the intensity of the magnetic field), which rotates the magnetization direction of the nuclei present in the body through an angle of 90°. After termination of the 90° pulse, the nuclear spins will perform a precessional motion around the field direction of the magnetic field Bo, thus generating a resonance signal (FID signal). Using the gradient magnetic fields $G_x$, $G_y$, $G_z$ whose field directions coincide with that of the magnetic field Bo and which have a gradient in the x, the y and the z-direction, respectively, a total magnetic field $B = B_o + G_x \cdot x + G_y \cdot y + G_z \cdot z$ can be generated.

After the 90° pulse, a field gradient $G_x$ is applied for a period $t_x$, and subsequently a field gradient $G_y$ for a period $t_y$, so that the precessional motion of the excited nuclear spins is influenced in a location-dependent manner. After this preparation phase (i.e. after $t_x + t_y$), a field gradient $G_z$ is applied and the FID signal (actually the sum of all magnetizations of the nuclei) is sampled at $N_z$ measuring instants during a period $t_z$. The described measuring procedure is subsequently repeated $1 \times m$ times with different values being used for $t_x$ and/or $t_y$ each time. Thus, $(N_z \times m \times 1)$ samples are obtained which contains the information concerning the magnetization distribution in a part of the body in the space x, y, z. The $1 \times m$ sampled signals each of $N_z$ samples are stored each time in a memory (in $N_z \times m \times 1$ memory locations), after which an image of the nuclear magnetization distribution is obtained by a 3-D Fourier transformation of the sampled signals of the FID signals.

It is alternatively possible, using selective excitation, to generate only the FID signal of nuclear spins in a 2-dimensional slice (having an orientation which can be selected at random) so that, for example, an FID signal need be generated only m times in order to obtain an image of the magnetization distribution in $m \times N_z$ points in the selected slice by way of a two-dimensional Fourier transformation. It will be clear that when use is made of the Fourier zeugmatography method, the time required for forming an image of the magnetization distribution may be as high as a few minutes. Such a measuring period is unacceptably long for a patient being examined who must remain motionless during this period.

As described hereinbefore the precession frequency $\omega$ of the nuclear magnetization M is given by $\omega=\gamma\cdot B$. The gyromagnetic ratio $\gamma$ solely depends on the kind of nucleus, if the nucleus is said to be "free". Generally the nuclei are not free, because they are influenced by "binding electrons", which surround the nuclei. This influence causes a phenomena called "chemical shift"; and the "bound" nucleus does not resonate at an angular frequency $\omega=\gamma\cdot B$, but at an angular frequency $\omega=\gamma\cdot B\cdot(1-\sigma)$. As can be seen the angular frequency $\omega'$, as well as the frequency shift $\Delta\omega=\omega-\omega'=\gamma\cdot B\cdot\sigma$, are proportional to the strength of the magnetic field B. Generally the value of $\sigma$ is small (magnitude $\approx 10^{-6}$). If the strength of the magnetic field has a sufficient level, it is possible to discriminate several peaks in a frequency spectrum due to the several different chemical shifts $\sigma$, which belong to several nuclei, each of which has a different chemical bond or link. The frequency spectrum of phosphor $P^{3+}$ in biological tissues shows peaks, which e.g. belong to phosphocreatine, ATP and inorganic phosphotes (see, "Localized measurements of the metabolism by N.M.R. methods", by R. K. Nunnally, Proceedings of an International Symposium on N.M.R.; Bowman-Gray School of Medicine, Wake Forest Univ., Winston-Salem, N.C. Oct. 1-3, 1981, pages 181-184). The mutual ratios of the amplitudes of these peaks give information about the state of metabolism in the tissue. It has been found useful to show such spectra as a function of the position in the tissue e.g. the position in a slice of a body to be examined. For obtaining such distributions of nuclear spin resonance spectra, methods and apparatus which have been shown and described in U.S. Pat. No. 4,070,611 are suitable. If such method or apparatus is used, then no gradient field should be applied during the measuring period.

Herebelow the previous indicated matter on N.M.R. spectroscopy will be elucidated with reference to an example. In this example the nuclear spin resonance spectra are determined as a function of coordinates in a two dimensional plane (x-, y-). In a first step a slice (x-y plane) having a thickness $\Delta z$ is excited by use of selective high frequency excitation. Thereafter during a preparation period the x- and y-gradient fields are applied. Then during a measuring period the generated resonance signal (FID signal) is sampled. No gradient field will be applied during such measuring period. In this way it is achieved that the sampled resonance signals are a function of image frequency $k_x$, $k_y$ and of time t. The value of the image frequencies $k_x$, $k_y$ are respectively determined by the gradient fields $G_x$ and $G_y$, as will be elucidated hereinafter. By repeating the whole measuring cycle (excitation, preparation and measuring) a large number of times and by applying each time gradient fields $G_x$ and $G_y$ having different values (and/or during different parts of the preparation period), a number of sampled resonance signals are taken each time, which signals are a function of time and belong each time to a different pair of image frequencies ($k_x$, $k_y$). The number of sampled signals are taken in such a way that a three dimensional (3-D) matrix ($k_x$, $k_y$, t) is completely filled. Upon carrying out a 3-D Fourier transform (three times a 1-D transform) a nuclear spin resonance spectrum has been determined at regular spaced coordinates x, y in the examined slice (the relation between $k_x$, $k_y$ and the coordinates x, y will be explained hereinafter).

The method as described can easily be extended to a 3-D volume. By selective excitation of the volume and by applying three gradient fields $G_x$, $G_y$ and $G_z$ during the preparation period, the sampled signals during the measuring period (no gradient field then being applied) are time dependent. The samples belong to the image frequency set ($k_x$, $k_y$, $k_z$). By repeating the above sequence a sufficient number of times (the values of $G_x$, $G_y$, $G_z$ being different each time), a 4-D matrix ($k_x$, $k_y$, $k_z$, t) has been filled. After carrying out a 4-D Fourier transform (four 1-D transforms, the order of which can be chosen at will) a frequency spectrum is obtained for regular spaced coordinates in the examined volume.

As pointed out above, the object to be examined may move, or be moved, during all excitations, preparations and measuring periods, which succeed each other in sequence. Regarding the vast amount of sampled signal to be taken a previous described method for determining a distribution of nuclear spin resonance spectra will take several minutes in the 2-D case and even a multiple thereof in the 3-D case.

It is the object of the invention to provide a method and an apparatus, which substantially reduces the time required for forming an image of the distribution of nuclear magnetization (having a resolution, which at least equals the resolution of an image obtained by known Fourier-zeugmatography methods) with respect to the time required by methods and apparatus according to the prior art.

It is a further object of the invention to provide a method and an apparatus, which substantially reduce the time required for forming a distribution of nuclear spin resonance spectra with respect to the time required by the methods and the apparatus known from the prior art.

To this end, a method in accordance with the invention is characterized in that during the measuring period an additional gradient magnetic field is generated whose gradient direction corresponds to the gradient direction of a gradient magnetic field generated during the preparation period and whose field direction coincides with the first direction. the additional gradient magnetic field is periodic in time with a period which is equal to the sampling interval. The effect exerted on the nuclear magnetization by the additional gradient magnetic field, integrated over a sampling interval is zero and at least one additional sampling operation is performed after the beginning and before the end of each sampling interval.

In accordance with the invention, in the presence of the generated FID signal an additional time-modulated gradient field is applied, so that one or even several additional FID signal sampling operations are performed during the period between two sampling operations (determined by the size of the body and the resolution in its image of a nuclear magnetization distribution in the known Fourier zeugmatography, or by the size of the object and the resolution in the coordinate dependent nuclear spin resonance spectrum). For each measuring cycle (preparation period + measuring period + waiting period), therefore, at least twice as many (or p times as many) samples are obtained, so that the number of measuring cycles to be performed is halved (or reduced by a factor p).

It is to be noted that a method is known for determining a nuclear magnetization distribution in which during a single measuring cycle (i.e. from one FID signal) suc information is derived, by utilizing time-modulated gradient fields, and that therefrom a two-dimensional nuclear magnetization distribution can be reconstructed. This method is referred to as the "echo-planar method" and is described in an article by P. Mansfield and I. L. Pykett, entitled "Biological and Medical Imaging by NMR", published in the Journal of Magnetic Resonance, 29, 1978, pages 355–373, and also in an article by L. F. Feiner and P. R. Locher, entitled "On NMR Spin Imaging by Magnetic Field Modulations", published in Applied Physics 22, 1980, pages 257–271. The echo-planar method utilizes time-dependent magnetic field gradients during the measurement of the FID signal. The echo-planar metnod enables a complete two-dimensional image to be obtained within the duration of a single FID signal. The determination of the nuclear magnetization distribution in a slice of the body to be examined is achieved by using, in addition to the uniform magnetic field in the z-direction, for example, a magnetic field gradient $G_z$ in the same direction and at the same time a (90°) high-frequency, amplitude-modulated pulse in order to generate a FID signal in a slice having an effective thickness $\Delta z$. Immediately after the high-frequency pulse, the gradient field $G_z$ is switched off and the FID signal is measured, for example, with an alternating gradient field $G_x$ and a stationary gradient field $G_y$ (image of the x-y slice).

The number of measuring points required for a complete 2-dimensional image is measured with a single FID signal according to the echo-planar method. In order to achieve the resolution required in practice, the gradient which periodically alternates in time must have a high frequency and a high intensity when this echo-planar method is used. This causes large variations (dB/dt) of the gradient magnetic field, which is undesirable for a patient. The intensity of the gradient fields used in the method in accordance with the invention is substantially lower than the intensity of the gradient fields used in the echo-planar method. Consequently, the variations of the field strength caused by modulation are also substantially smaller, which is an advantage.

The invention will be described in detail hereinafter with reference to the embodiments shown in the drawing figures wherein:

FIG. 1a shows a coil system which forms part of a device for performing a method in accordance with the invention;

FIG. 1b diagrammatically shows the shape of the x/y gradient coils;

Figure 1A:
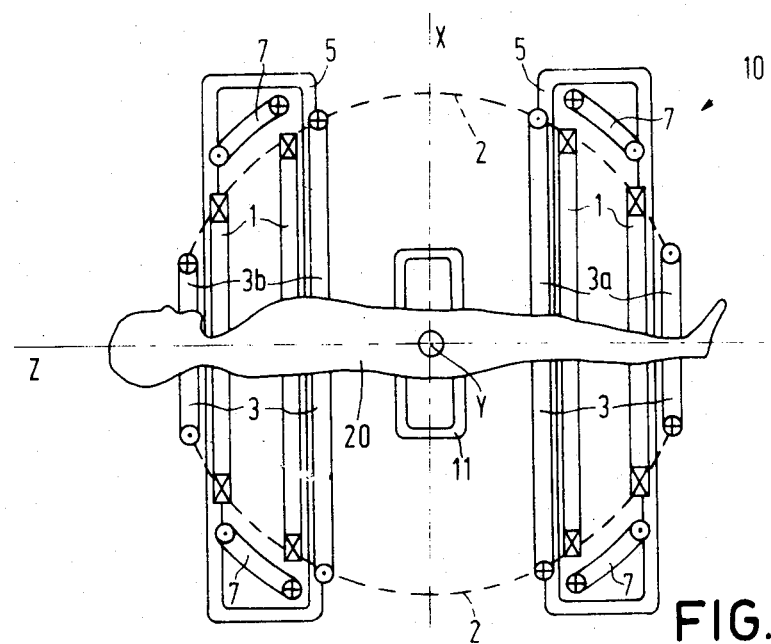
FIG. 1c shows a shape of coils generating a high-frequency field.

FIG. 1a shows a coil system 10 which forms part of a device used for determining a nuclear magnetization distribution in a part of a body 20. This part has a thickness of, for example, $\Delta z$ and is situated e.g. in the x-y plane of the x-y-z coordinate system shown. The y-axis of the system extends upwards, perpendicularly to the plane of the drawing. The coil system 10 generates a uniform stationary magnetic field $B_o$ having a field direction parallel to the z axis, three gradient magnetic fields $G_x$, $G_y$ and $G_z$ having a field direction parallel to the z axis and a gradient direction parallel to the x, y and z axis, respectively, and a high-frequency magnetic field. To this end, the coil system 10 comprises some main coils 1 for generating the stationary uniform magnetic field $B_o$ having an intensity of some tenths of a tesla. The main coils may be arranged, for example, on the surface of a sphere 2 whose center is situated at the origin O of the Cartesian coordinate system x, y, z with the axes of the main coils 1 being coincident with the z axis.

The coil system 10 furthermore comprises, for example, four coils 3a, 3b which are arranged on the same spherical surface and which generate the gradient magnetic field $G_z$. To this end, a first set 3a is excited by a current in the opposite sense with respect to the current direction in the second set 3b; this is denoted by ⊙ and ⊗ in the Figure.

Therein, ⊙ mans a current entering the section of the coil 3 and ⊗ means a current leaving the section of the coil.

Figure 1B:
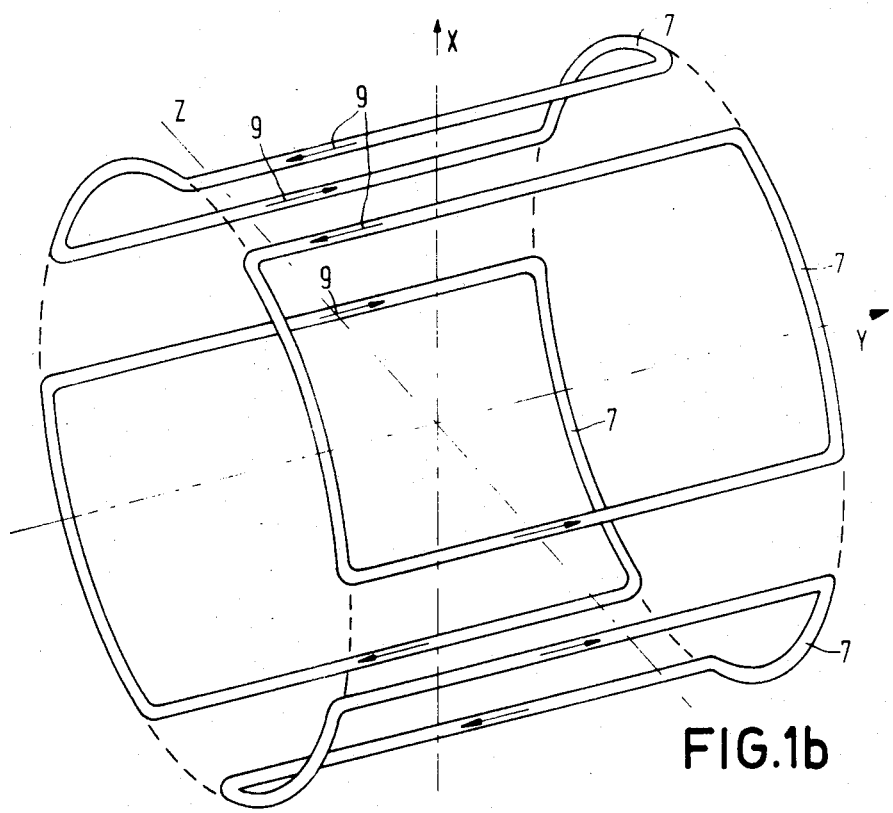

The coil system 10 comprises, for example, four rectangular coils 5 (only two of which are shown) or four other coils such as, for example, "Golay coils" for generating the gradient magnetic field $G_y$. In order to generate the gradient magnetic field $G_x$, use is made of four coils 7 which have the same shape as the coils 5 and which have been rotated through an angle of 90° around the z axis with respect to the coils 5. For a better impression of the shape of the coils 7 (and 5), a perspective view is given in FIG. 1b. The direction in which an electric current passes through the coils 7 is denoted by arrows 9.

Figure 1C:
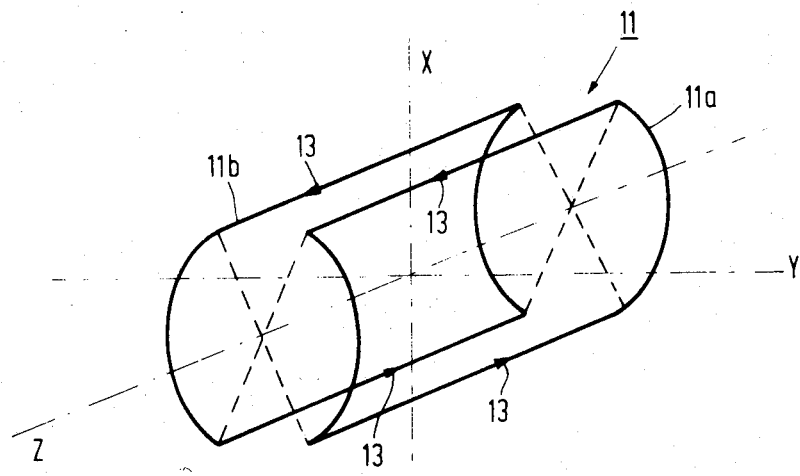

FIG. 1a also shows a coil 11 whereby a high-frequency electromagnetic field can be generated and detected. FIG. 1c is a perspective view of the coil 11. The coil 11 comprises two halves 11a and 11b which are electrically interconnected so that the current directions denoted by arrows 13 are obtained during operation.

Figure 2:
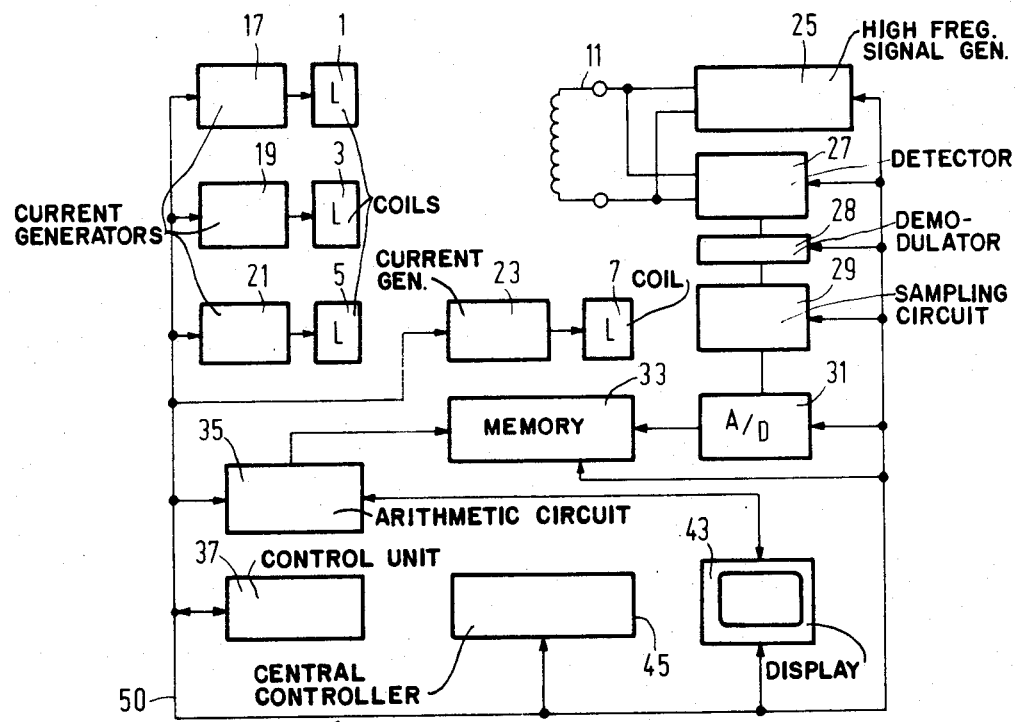
FIG. 2 shows a device for performing a method in accordance with the invention.

FIG. 2 shows a device 15 for performing a method in accordance with the invention. The device 15 comprises coils 1, 3, 5, 7 and 11 which have already been described with reference to FIGS. 1a, 1b and 1c, current generators 17, 19, 21 and 23 for the excitation of the coils, 1, 3, 5, and 7, respectively, and a high-frequency signal generator 25 for the excitation of the coil 11. The device 15 also comprises a high-frequency signal detector 27, a demodulator 28, a sampling circuit 29, processing means such as an analog-to-digital converter 31, a memory 33 and an arithmetic circuit 35 for performing a Fourier transformation, a control unit 37 for controlling the sampling instants and also a display device 43 and central control means 45 whose functions and relationships will be described in detail hereinafter.

The device 15 performs a method for determining the nuclear magnetization distribution in a body 20 as will be described hereinafter. The method comprises several steps. Before the "measurement" is started, the nuclear spins present in the body are excited to resonance. The resonance excitation of the nuclear spins is performed by the switching on of the current generator 17 by the central control unit 45, so that the coil 1 is excited. A stationary and uniform magnetic field $B_o$ is thus generated. Furthermore, the high-frequency generator 25 is switched on for a brief period of time, so that the coil 11 generates a high-frequency electro-magnetic field (r.f. field). The nuclear spins in the body 20 can be excited by the applied magnetic fields with the excited nuclear magnetization enclosing a given angle, for example, 90° (90° r.f. pulse) with respect to the uniform magnetic field $B_o$. The location where and which nuclear spins are excited depends inter alia on the intensity of the field $B_o$, on any gradient magnetic field to be applied, and on the angular frequency $\omega_o$ of the high-frequency electromagnetic field, because the equation $\omega_o = \gamma B_o$ (1) is to be satisfied, in which $\gamma$ is the gyromagnetic ratio (for free protons, for example, and for H2O protons, $\gamma/2\pi = 42.576$ MHz/T). After an excitation period, the high-frequency generator 25 is switched off by the central control means 45. The resonance excitation is performed at the beginning of each measuring cycle. For some embodiments further r.f. pulses are induced in the body. The r.f. pulses are first 90° r.f. pulses and a series composed of 180° (as well as 90°) r.f. pulses which are periodically induced into the body. The first case is referred to as "spin-echo". Spin echo is inter alia described in the article by I. L. Pykett "NMR Imaging in Medicine", published by Scientific American, May 1982.

During the next step, usable samples are collected. For this purpose use is made of the gradient fields which are generated by the generator 19, and 21, 23, respectively, under the control of the central control means 45. The detection of the resonance signal (referred to as the FID signal) is performed by the switching-on of the high-frequency detector 27, the demodulator 22, the sampling circuit 29, the analog-to-digital converter 31 and the control unit 37. This FID signal appears as a result of the precessional motion of the nuclear magnetizations around the field direction of the magnetic field $\vec{B}_o$ due to the r.f. excitation pulse. This nuclear magnetization induces an induction voltage in a detection coil whose amplitude is a measure for the nuclear magnetization.

The analog, sampled FID samples originating from the sampling circuit 29 are digitized (converter 31) and stored in a memory 33. After expiration of the measuring period T, the central control means 45 deactivates the generators 19, 21 and 23, the sampling circuit 29, the control unit 37 and the analog-to-digital converter 31.

The sampled FID signal is stored in the memory 33 and, after Fourier transformation in the arithmetic circuit 35, it produces a spectrum whose amplitudes contain data concerning nuclear magnetizations. Unfortunately, in a 2D or 3D image, translation from spectrum to location is not possible. Therefore, the resonance signal produced by the arithmetic circuit 35 is first stored in the memory 33. The method used for the translation to location depends on the use of the gradient magnetic fields.

The method in accordance with the invention notably concerns an imaging aspect of NMR. For a proper understanding of the invention, it is necessary to consider first the theory of NMR imaging. This will be done on the basis of a simple case involving the imaging of a one-dimensional object (referred to hereinafter as 1-D).

Assume that the object, containing NMR-active nuclei such as, for example, protons, is present in a homogeneous magnetic field $\vec{B}_o$. Using a radio-frequency excitation pulse (90° r.f. pulse), a magnetization of nuclei transverse to the magnetic field $\vec{B}_o$ is obtained. After the excitation, a gradient magnetic field is added to the $B_o$ field during a preparation period. This gradient extends in the direction of the 1-D object which is arranged, for example, along the x axis of an x, y, z coordinate reference system. The gradient magnetic field is then described by:

$$G_x = \frac{dB_o}{dx} \cdot \bar{x} \qquad (2)$$

in which $\bar{x}$ is a unity vector in the x direction. It is to be noted that when the gradient magnetic field $G_x$ is homogeneous, which means that $G_x$ is independent of x, it describes a linear variation between the intensity of the magnetic field and the x coordinate. In the presence of $G_x$ the nuclear magnetizations will perform a precessional motion with a frequency which is dependent on their coordinates in accordance with the relation $$\omega(x) = \omega_o + \gamma \cdot G_x \cdot x \qquad (3)$$

Now the signal induced in the coil does not consist of a single frequency $\omega_o$, but of a series of frequencies $\omega(x)$. By performing a Fourier analysis of the measured signal, the intensity of the precessional nuclear magnetization can be determined as a function of the frequency. Because the frequency is now unambiguously dependent on the coordinates (expression (3)), the nuclear magnetization has been determined as a function of the x coordinate, so that an NMR image of the 1-D object has been made. The image information is then formed by the magnitude of the nuclear magnetization. Obviously, this is co-determined by the density $\rho$ of the NMR-active nuclei, but in general other parameters such as the spin lattice relaxation time $T_1$ and spin-spin relaxation time $T_2$ also have an effect on the image obtained.

The induction voltage to be measured is quadrature-detected. This means that the signal is mixed with a reference signal which generally has the same frequency $\gamma_o$ as the radio-frequency excitation pulse. The measured signal is thus shifted on the frequency axis with the shift amounting to $\gamma_o$. For quadrature-detection, the signal is mixed once with a first reference having a phase $\phi$ with respect to the radio-frequency signal used for the excitation, and once with a second reference ($\phi + 90°$) which has the same frequency but whose phase has been shifted 90° with respect to the first reference.

This means that in a coordinate system which performs a precessional motion at a frequency $\omega_o = 2\pi\gamma_o$ around $\vec{B}_o$, the components of the total nuclear magnetization are determined, that is to say the components in a system which is stationary within the rotating system and having an axis enclosing an angle $\phi$ with respect to the axis along which the r.f. field $\vec{B}_1$ is directed during the excitation. Thus, when $\phi = 0$, the components of the total nuclear magnetization are determined which are in phase and in 90° shifted phase, respectively, with respect to the r.f. field of the excitation pulse. By utilizing a quadrature-detection, a distinction can be made between clockwise and counterclockwise rotating magnetizations in the rotating system. Accordingly, after quadrature-detection positive and negative frequencies can be distinguished. When the 1-D object is symmetrically arranged around the origin (which is the point at which the gradient does not contribute to the external field), after quadrature-detection the signal will be situated in the frequency band extending from $-\omega_1$ to $+\omega_1$. Therein, $\omega_1 = \gamma \cdot G_x \cdot 1$ in which 1 is half the length of the object. The two signals obtained after quadrature-detection will be referred to hereinafter as the real and the imaginary signal, respectively. The Fourier transformation of these signals can not be described in a complex manner. The complex time signal $$f(t) = f_1(t) + i \cdot f_2(t) \tag{4}$$

is written as follows after the Fourier transformation:

$$g(\omega) = \int_{-\infty}^{\infty} f(t) e^{i\omega t} dt = g_1(\omega) + i g_2(\omega) \tag{5}$$

in which $$g_1(\omega) = \int_{-\infty}^{\infty} f_1(t) \cos(\omega t) dt - \int_{-\infty}^{\infty} f_2(t) \sin(\omega t) dt$$

and $$g_2(\omega) = \int_{-\infty}^{\infty} f_2(t) \cos(\omega t) dt + \int_{-\infty}^{\infty} f_1(t) \sin(\omega t) dt.$$

Thus the spectrum $g(\omega)$ is now also complex. It has been assumed in the foregoing that the functions $f_1$ and $f_2$ on the entire time axis are known as continuous functions. In practice, however, this is not simply the case and the low-frequency signals $f_1$ and $f_2$ are measured by sampling. This is subject to the sampling theorem: that when a signal is to be unambiguously defined, at least two samples must be taken per period of the occurring highest frequency. For the 1-D object, this is $$\gamma_1 = \omega_1/(2\pi) \tag{6}$$

The sampling interval $t_m$, which is the period of time expiring between two successive sampling operations, must then be at least $$(2 \cdot \nu_1)^{-1} = \frac{\pi}{\omega_1} \tag{7}$$

Conversely, for a sampling interval $t_m$ of the real as well as the imaginary signal, the width of the frequency band is $1/t_m$. When n equidistant samples are taken from the real as well as the imaginary time signal, $g_1(\omega)$ as well as $g_2(\omega)$ will also be described by n points. The spacing of these points in the frequency space, therefore, is $$\frac{1}{n \cdot t_m}.$$

The more points are taken in the time interval for the same $t_m$, that is to say the longer measuring is performed, the finer the resolutions in frequency space will be (real as well as imaginary), and hence, also the resolution in the image-space.

Resolution enhancement can also be achieved in another manner, for example, by making the gradient twice as strong. In that case the object will correspond to a bandwidth which is twice as large, and sampling must be twice as fast. When 2n samples are taken on the time signal, the total measuring time will be the same again, but the frequency band will be divided into 2n intervals. Because the object fills the entire band, this means that 2n space intervals $\Delta x$ are situated on the object 2n. Thus, the resolution will be twice as high. An example will now be described for the purpose of illustration. Consider a 1-D object which contains protons, has a length $21 = 10$ cm and is situated in a gradient field $G_x = 23.49 \times 10^{-4}$ T/m; a frequency band $\gamma_1 = \gamma \cdot G_x \cdot 2 \cdot \frac{1}{2} \pi = 10$ kHz then corresponds to the length of the object. Because the object is symmetrically arranged around the origin, the highest frequency occurring is 5 kHz, so that for the sampling intervals $t_m = 100$ μs is chosen. When, for example, 128 samples are taken, the signal is measured during 12.8 ms.

After Fourier transformation, the frequency-intervals amount to $(n \cdot t_m)^{-1} = 78$ Hz. This corresponds to $$x = \frac{1}{n \, t_m} \cdot \frac{1}{\nu_1} 2 L,$$

so that $\Delta x = 0.78$ mm for each space interval.

As has already been stated, several possibilities exist for the doubling of the resolution. The first possibility is to keep the gradient the same, and also $t_m$, and to double the number of samples; thus, in the above case 256 samples instead of 128 samples. The overall measuring period then becomes 25.6 ms. The frequency intervals after Fourier transformation are then $$\frac{1}{n \cdot t_m} = 39 \text{ Hz, which corresponds to } \Delta x =$$

$$\frac{39}{10,000} \times 100 \text{ mm} = 0.39 \text{ mm}$$

as the length for each space interval. In the second case, the gradient becomes twice as large: $G_x = 46.98 \times 10^{-4}$ T/m. A body-length of 10 cm then corresponds to a bandwidth of 20 kHz. The highest frequency is then 10 Hz and, consequently, $t_m$ amounts to 50 μs. When 256 samples are taken, measurement of the signal again requires 12.8 ms. In the frequency domain the intervals are then $(n \cdot t_m)^{-1} 78$ Hz, which again corresponds to $$\Delta x = \frac{78}{20,000} \cdot 100 \text{ mm} = 0.39 \text{ mm}.$$

Summarizing it may be stated that a higher resolution is obtained either by longer measuring periods or by utilizing larger gradients. Evidently, combinations thereof are also feasible. It is to be noted, however, that larger gradients generally cause more noise. On the other hand, the measuring period cannot be indefinitely prolonged because of relaxation effects while inhomogeneities in the magnetic field $\overline{B}_o$ may lead to unacceptable distortion of the image in the case of weak gradients. A compromise will usually be chosen in practice.

The entire problem can also be approached in a different manner. Let us again consider a 1-D object with the coordinate x. The spatial Fourier transform of this image then has a coordinate $k_x$ and describes the spatial frequencies ("lines per cm") used to compose the image. In the first instance one would think that the image function $F(x)$ is a real function. In NMR imaging utilizing quadrature-detection, the distribution of two of the three components of the nuclear magnetization is measured. This is because the components perpendicular to $\overline{B}_o$ produce an induction voltage in the radio-frequency coil. Each of the components can be described by an image function, or in other words $F(x)$ is a function which consists of two parts, $F_1(x)$ and $F_2(x)$ which describes the magnitude of the mutually perpendicular components (each of which is perpendicular again to $\overline{B}_o$) as a function of the coordinate x. This is written as $F(x)=F_1(x)+i\cdot F_2(x)$. The complex Fourier transform $G(k_x)=G_1(k_x)=i\ G_2(k_x)$ is found from:

$$G(k_x) = \int_{-\infty}^{\infty} F(x)e^{(ik_x \cdot x)}dx \tag{8}$$

It is to be noted that $k_x \cdot x$ represents a phase angle. In 1-D spin imaging, via the gradient $G_x$ there is a one to one correspondence between the location x and the NMR frequency $\omega_x$ in accordance with the relation $$\omega_x = \omega_o + \gamma \cdot G_x \cdot x$$

Because of the quadrature-detection of the signals, the frequency $\omega_o$ will be ignored hereinafter. At a given instant t after the application of the constant gradient $G_x$ a magnetization at the location x has a phase $\gamma \cdot G_x \cdot x \cdot t$ with respect to the phase at the instant $t=0$. $\gamma \cdot G_x \cdot t$ may now be interprted as the spatial frequency $k_x$. When the gradient is not constant, the phase angle of the magnetization at the instant t is given by $$\int_0^t \omega_x(t')dt' = \gamma \cdot x \cdot \int_0^t G_x(t')dt'$$

and $$\gamma \int_0^t G_x(t')dt'$$

is associated with $k_x$. When the signals $f_1(t)$ and $f_x(t)$ are measured a period t after the application of the gradient $G_x$, they will be equal to $G_1(k_x)$ and $G_2(k_x)$, respectively, except for a constant. Here $$k_x = \gamma \int_0^t G_x(t')dt' \tag{9}$$

The constant depends on various instrumental parameters, such as quality factor of the coil, gain factors of r.f.-amplifiers, etc. Because only the variation of the nuclear magnetization is determined, an absolute measurement is not important and the constant can be ignored hereinafter.

Because the origin has been chosen in the image space in the center of the object, an origin in the spatial frequency space is also chosen in the center. Thus, negative spatial frequencies are also permitted. The value of these frequencies can be determined, for example, by measurement of the signal after a constant, negative gradient has been present for a given period t. In practice, usually negative and positive spatial frequencies are measured in one FID. This can be done for example, by first initiating a negative gradient until the minimum $k_x$ is reached prior to the sampling of the signal. Subsequently, the sign of the gradient is reversed and the signal is sampled. During sampling, the spins will all be in phase again at a given instant, provided that the effects of inhomogeneities in the static magnetic field are ignored or somehow compensated for (for example, by using a spin-echo technique). This instant corresponds to $t=0$. At this instant the phases of the spins are such that no gradient has yet been active. At instants before this point, the negative spatial frequencies are measured, while after this point the positive spatial frequencies are measured. A real and an imaginary image can be reconstructed on the basis of these frequencies.

Summarizing, it may be stated that when the two components of the signal (real and imaginary) are measured at a given instant t with respect to the reference instant $t=0$, the amplitude of the image frequency $$k_x = \int_0^t \gamma \cdot G_x(t')dt'$$

has been unambiguously defined. When the two measured values are referred to as $G_1$ and $G_2$, respectively, they represent a sinusoidal intensity modulation in the real and the imaginary image (complex image wave) whose wave-length equals $$\frac{2\pi}{k_x}.$$

The phase of this image wave, measured in the origin $x=0$ (which means at the point where the gradient does not contribute to the field) is given by arc tan $(G_2/G_1)$, i.e. by the phase angle of the signal at the instant t. The amplitude of this wave is $$(G_1^2 + G_2^2)^{\frac{1}{2}}.$$

Because only a finite number of spatial frequencies are measured, the resolution is limited. The resolution can be enhanced by measuring higher spatial frequencies (positive as well as negative). Because $$k_x = \int_0^t \gamma \cdot G_x(t')dt'$$

this can be achieved, for example, by prolonging the measurement or by increasing the gradient. This is in accordance with the foregoing.

The question is now which spatial frequencies should actually be measured in order to obtain an image having a given resolution. For the answer to this question, reference is made to the previous description of the sampling of the signal. When the gradient $G_x$ is constant, it must be insured that at least two additional sampling operations are performed per period of the highest frequency occurring. This implies a sampling interval of less than $\pi/\omega_1$. This means that the magnetization associated with the highest frequency $\gamma_1$ occurring is rotated slightly less than 180° from one sampling operation to another. When the sampling interval is again denoted by $t_m$, therefore $\gamma \cdot G_x \cdot 1 \cdot t_m$ is slightly smaller than $\pi$, so $\gamma \cdot G_x \cdot t_m$ is slightly smaller than $\pi/1$. For a reproduction of the complete object having a length of 2l in n points, the signal must also be sampled n times using this $t_m$.

This can be translated into a sampling of $k_x$ points. The sampling interval $t_m$ corresponds to an interval $\Delta k_x = \gamma \cdot G_x \cdot t_m$ (10), and this should be slightly smaller than $\pi/1 = 2 \cdot \pi/L$ (11) in which $L=2l$, i.e. the total length of the 1D object. The fact that it is necessary to measure at n different instants at intervals $t_m$ in order to achieve a resolution of n points can be translated into a measurement at n different $k_x$ values with interval $\Delta k_x$.

As has already been stated, the aim is to measure the spatial frequencies which are centered around $k_x=0$. For sampling in the presence of a constant gradient magnetic field $G_x$, this means that they must be centered around the instant at which the gradient field $G_x$ does not make an effective contribution $$\left( k_x = \int_t G_x dt' = 0 \right)$$

to the phase of the nuclear magnetization.

On the basis of this knowledge it is also possible to attack the problem of the imaging of 2-D and 3-D objects. It is to be noted that the selective excitation technique can be used to ensure that image information is collected only from a thin slice of a 3-D object, so that the use of a 2-D technique need not be restricted to actual 2-D objects.

Completely analogously to the 1-D method, now an image function $F(x, y) = F_1(x, y) + i F_2(x, y)$ is defined whose spatial Fourier transform $G(k_x, k_y)$ is:

$$G(k_x, k_y) = \int \int F(x, y) e^{i(k_x x + k_y y)} \, dx \, dy$$

G is complex again: $G(k_x, k_y) = G_1(k_x a, k_y + iG_2(k_x, K_y)$. Both components $G_1$ and $G_2$ can be identified again with the two components of the time signal, for which $$k_x = \int_0^t \gamma \cdot G_x(t') \, dt' \text{ and } k_y = \int_0^t \gamma \cdot G_y(t') \, dt'$$

Therein, $G_y$ is a gradient in the y direction $$\vec{G_y} = \frac{d B_0}{d y} \cdot \vec{y}$$

Actually, the spin-imaging experiment again is the determination of the values of the spatial frequencies ($k_x$, $k_y$), the resolutions of the x and the y direction, respectively, again being determined by the highest spatial frequencies $k_x$ and $k_y$ still measured. The expansion to the 3-D case can be simply realized by introduction of $$k_z = \int_0^t \gamma \cdot G_z(t') \, dt'$$

However, for the sake of simplicity the description will be restricted to the 2-D case. The determination of the intensities of the spatial frequencies ($k_x$, $k_y$) is performed by measurement of the FID signal after the magnetizations have been subjected to the effect of the gradient $G_x$ and $G_y$ for a period t. Then:

$$k_x = \gamma \cdot \int_0^t G_x(t') \, dt'$$

$$k_y = \gamma \cdot \int_0^t G_y(t') \, dt'$$

It is to be noted that the above description also holds when the spin-echo technique is used. However, in that case the sign of the results of the integrals $$\int_{t_1}^{t_2} \gamma \cdot G_i(t') \, dt'$$

must be changed each time a 180° r.f. pulse is applied at instants $t_2$. Here $t_1$ is the instant after application of a preceding 180° r.f. pulse. The sign of the results of the integrals must be changed, because the effect exerted by the gradient field $G_i$ until the instant $t_2$ is the same as if the gradient field $G_i$ had the opposite direction and no 180° r.f. pulse had been applied.

The signals are again sampled in the 2-D case. This means that only the value of given spatial frequencies is determined. These spatial frequencies may form a rectangular lattice in the ($k_x$, $k_y$) space, but in principle any type of lattice is feasible (polar or rhombic lattices). A polar lattice is used in the so-called projection reconstruction (see, for example, P. R. Locher, Nederlands Tijdschrift voor Natuurkunde, A47, (3), 114, 1981). For the description reference will only be made to a rectangular lattice, but this is not a restriction. According to the known Fourier zeugmatography the magnetizations are first exposed to the effect of, for example, $G_y$ for a given period of time. After $G_y$ has been switched off, the signal is measured in the presence of $G_x$. Sampling at the instant t again defines the value of the spatial frequency $$\left( k_x = \gamma \cdot \int_0^t G_x(t') \, dt'; k_y = \gamma \int_0^t G_y(t') \, dt' \right)$$

In this diagram the information is collected on a line in the ($k_x$, $k_y$) space which extends parallel to $k_y=0$. For the measurement of all desired spatial frequencies, this diagram must be repeated for other values of $$k_y = \gamma \int_0^t G_y(t') \, dt.$$

In practice this is usually done by variation of the amplitude and/or duration of $G_y$ from one measurement to another.

The question now is how a given object must be sampled in order to obtain a desired resolution $N_x \times N_y$. When the total dimension of the object in the $i^{th}$ direction (i=x, y) is $L_i$, the distance $\Delta k_i$ between two successive values of $k_i$ at which measurement takes place must be less than $2\pi/L_i$. For a resolution of $N_i$ points in the $i^{th}$ direction, measurement must be performed at $N_i$ different values of $k_i$ with the $k_i$ values requiring a spacing equal to $\Delta k_i$.

An embodiment of a method in accordance with the invention will be described with reference to FIGS. 2, 3a and 3b. Using the high frequency coil 11, a 90° pulse P1 is generated after the activation of the main coils 1 which generate the stationary homogeneous magnetic field $B_o$. The resonance signal F1 then occurring is allowed to decay when using a spin-echo technique and after a period of time $t_{v1}$ a 180° pulse P2 is generated by the high frequency coil 11. During a part of the period $t_{v1}$ a gradient field $G_x$ (denoted by a curve G1) is generated for reasons yet to be described. After a period of time $t_{v2}$, being equal to $t_{v1}$, an echo resonance signal F2 produced by the 180° pulse P2 will generally reach a peak value. This instant $t_o$ will be defined as the instant $t=0$. The use of the so-called spin-echo technique (180° pulse P2) prevents the occurrence of phase errors in the resonance signals. Such errors are caused by inhomogeneities in the stationary magnetic field $B_o$. The echo-resonance signal F2 is sampled at sampling intervals $t_m$ during which a gradient magnetic field $G_x$ (denoted by a curve G2) is present. The samples obtained are associated with the various $k_x$ values $$\left( k_x = \gamma \cdot \int_o^t G_x(t') \, dt' \right).$$

As has already been deduced, positive as well as negative $k_x$ values should be determined. Consequently, during the period $t_{\nu 1}$ also a gradient field $G_x$ is generated whose value $$\int_{t_{\nu 1}} \gamma \cdot G_x(t') dt$$

is exactly equal to the value $$\int_{t_{\nu 2}} \gamma \cdot G_x(t') dt'.$$

It is thus achieved that the overall effect of the gradient magnetic field $G_x$ on the nuclear spins in precessional motion is nil at the instant $t_o$ $$\left( \int_{t_{\nu 1} + t_{\nu 2}} \gamma \cdot G_x(t') dt' = O \right),$$

so that at the instant $t_o$ a sample of the resonance signal is taken which is associated with the spatial frequency $k_x = 0$. In other words, the foregoing means that thanks to the application of the gradient magnetic field $G_x$ during $t_{\nu 1}$ it is achieved that at the starting instant $t_s$ of a measuring period $T = N \cdot t_m$ a sampling operation is performed which is associated with the most negative frequency $k_x$, a less negative spatial frequency $k_x$ being associated with each subsequent sample (for $t_o$, $k_x = 0$) until ultimately at the end $t_e$ of the measuring period T a sample is taken which is associated with the most positive spatial frequency $k_x$.

According to the foregoing, when no gradient magnetic field $G_y$ is applied, spatial frequencies $k_x$ are determined at which the spatial frequency $k_y$ is always zero. In FIG. 3b the amplitudes of the samples taken are plotted on a $k_x - k_y$ slice. The described sampling method results in a graph S1 along the line $k_y = 0$. The distance $\Delta k_x$ between the positions of the samples in the $k_x - k_y$ plane is determined by the formula $$\Delta k_x = \gamma \cdot \int_{t_m} G_x(t') \cdot dt' = \gamma \cdot G_x \cdot t_m$$

in which $t_m$ is the sampling interval.

When a gradient magnetic field $G_y$ is applied during the period $t_{\nu l}$ (the period of time between the 90° pulse P1 and the 180° pulse P2), denoted by a broken line in FIG. 3 in the $G_y - t$ graph, the integral $$k_y = \gamma \cdot \int_{t_{\nu l}} G_y(t') \, dt'$$

will be unequal to zero at the beginning of the measuring time T and samples will be taken which are associated with the spatial frequency pairs $(k_x, k_y)$. The spatial frequency $k_y$ does not change during the measuring period T and the frequencies $k_x$ again increase from most negative to most positive. In other words, in FIG. 3b on a line $k_y \neq 0$ samples are inserted as a function of $k_x$, the distance $\Delta$ between the two lines $k_y = 0$ being determined by $$\Delta = \gamma \cdot \int_{t_{\nu l}} G_y(t') dt'.$$

Figure 3A:
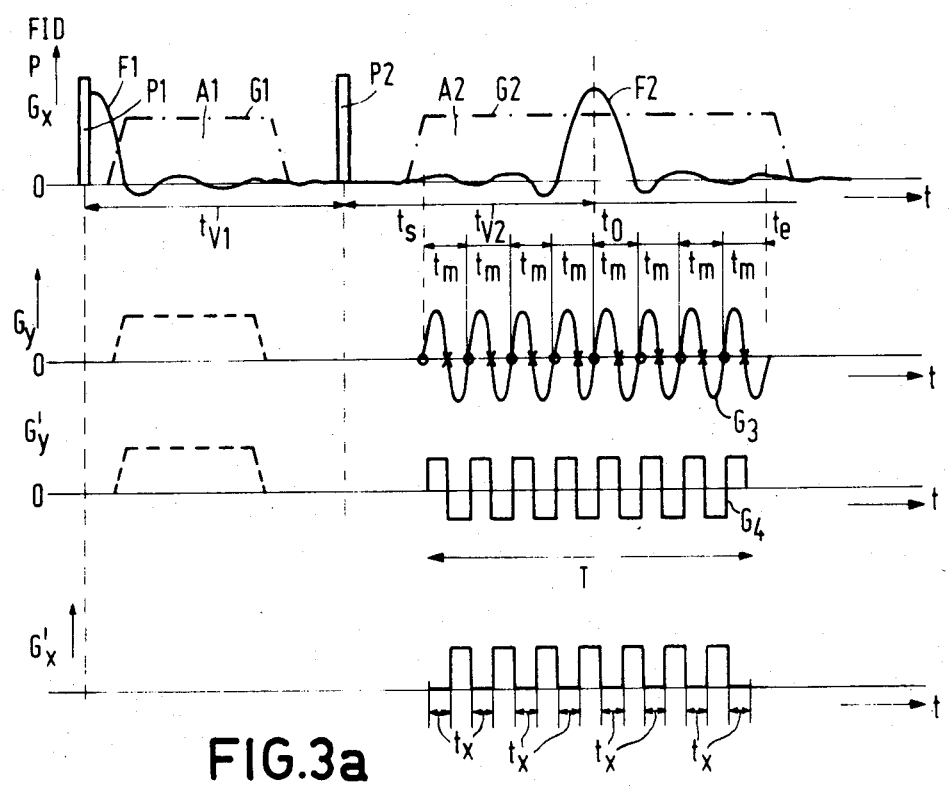
FIGS. 3a and 3b illustrate a simple version of a method in accordance with the invention.

The samples are denoted by 0 in FIG. 3 i b. The associated sampling instants are also denoted by 0 in FIG. 3a. It will be clear that the distance $\Delta$ between two lines can be adjusted by variation of the intensity of the gradient field $G_y$ or by variation of the period of time during which the gradient magnetic field $G_y$ is present or both. In the method in accordance with the invention, during the measuring period T, a (time modulated) additional gradient magnetic field $G_y$ is applied which is denoted by the curve G3 in FIG. 3a. The additional gradient magnetic field $G_y$ is modulated so that:

$$\int_{t_m} G_y(t') dt' = O \text{ and } \int_{i \cdot t_m}^{i \cdot t_m + \frac{1}{2}t_m} G_y(t') dt' \neq O$$

so that samples can be taken which are associated with different values of $k_y$ within a sampling interval $t_m$, the original samples which are denoted by 0 in FIG. 3a not being disturbed thereby.

Because the above integral is not zero between the instants denoted by 0 and X in FIG. 3a, a maximum distance from the line L1 is reached after one-half period $t_m$ (assuming that $G_y$ is sinusoidal (G3) or square-wave (G4))

$$\Delta k_y = \gamma \int_o^{\frac{1}{2}t_m} G_y(t') \, dt'$$

When sampling is performed at the instants which are indicated by x in FIG. 3a, these samples will be associated with a line L2 which extends parallel to the line L1 at a distance $\Delta k_y$. The points situated on the line L2, however, have been shifted through $\frac{1}{2} \cdot \Delta k_x$ in the $k_x$ direction, because the gradient field in the x direction also has its effect during the first half period of G3 (or G4). This shift can be avoided by modulating the gradient magnetic field $G_x$ in such a way that a the gradient direction is not reversed (the measurements range from $-k_x$ to $+k_x$) and b the gradient magnetic field $G_x$ has an intensity zero during the part of the sampling interval $t_m$ during which sampling operations are performed. These parts are denoted by $t_x$ in FIG. 3a and are plotted in a $G'_x - t$ graph which shows an example of a modulated gradient magnetic field $G'_x$.

The sampling interval $t_m$ depends on the size of the object and the strength of the gradient field. In general the sampling interval $t_m$ has a value between 10-100 μs in the known Fourier zeugmatography. The method in accordance with the invention utilizes the duration of the sampling interval for performing at least one further sampling operation during the interval $t_m$ (denoted by x in FIG. 3a). It is to be noted that two signals are to be sampled, even though only one amplitude value (for each instant) of the resonance signal is shown in FIG. 3a and in FIG. 3b (for some $k_y$ value). As has already been explained these two signals are obtained by means of a quadrature-detection of the resonance signal. It is also to be noted in the case of use of the spin echo technique as described above there will virtually exist a point-symmetry with respect to the point $k_x = k_y = 0$, so that actually sampling operations are required, for example, either for all $k_x$ (from negative to positive maximum), where $k_y > 0$, or for all $k_y$ (from negative to positive maximum), where $k_x > 0$. The graph as shown in FIG. 3b is point-symmetrical, but the imaginary $k_x - k_y$ graph is anti-symmetrical with respect to $k_x = k_y = 0$.

The periodic variation of $G_y$ during the period of the sampling interval $t_m$ is chosen so that the additional phase coding produced by $G_y$ at the end of each sampling interval is $$\left( \gamma \cdot \int_0^{t_m} G_y(t') \, dt' = 0 \right)$$

If this were not so, the samples at the beginning of each next sampling interval would no longer be situated on the reference line L1 but would be shifted along the $k_y$-axis. Consequently, each point thus measured is associated each time with a different value of $k_y$. Because it is attractive for the processing of the samples that these points are associated with a rectangular $k_x - k_y$ lattice, such a measuring method is inefficient and necessitates additional calculations. The above integral $$\left( \gamma \cdot \int_0^{t_m} G_y(t') \, dt' = 0 \right)$$

means that the surfaces enclosed by the curve of $G_y$ (in Figure 3) for $G_y > 0$ and $G_y < 0$ must be the same within a sampling interval.

When the applied gradient magnetic field $G_x$ is constant in time, the sampling interval $t_m$ should be slightly smaller than $2\pi/(\gamma \cdot G_x \cdot L_x)$, as has already been deduced. When oversampling is used during sampling (for example, to eliminate noise by way of digital filtering), obviously the period of $G_y$ must be adapted thereto. The amplitude $G_y$ follows directly from the requirement that an interval $\Delta k_y$ must be bridged in one half period of $G_y(t)$. For the further description it will be assumed that the sampling intervals $t_m$ on a line parallel to $k_y = 0$ are equal to $2\pi/\gamma \cdot G_x L_x$ (12). Fold-back effects which could be caused thereby can be prevented by choosing the object to be slightly smaller than $L_x$ in the x direction. The quantity $L_x$ must be considered as an upper limit for the dimension of the object in the x direction. The same definition is used for the y-direction: choose $L_y$ as the upper limit for the dimension in the y direction; in that case:

$$\Delta k_y = 2\pi/L_y \tag{13}$$

The value of the amplitude $\overline{G}_y$ of the gradient $G_y(t)$ can now be determined as follows:

(a) squarewave varying gradient:

$$\gamma \cdot \overline{G}_y \cdot \frac{t_m}{2} = \Delta k_y$$

because the total surface must be covered in one half period; furthermore, in accordance with the expressions (12) and (13)

$$t_m = \frac{2\pi}{\overline{G}_x \cdot \gamma \cdot L_x} \text{ and } \Delta k_y = \frac{2\pi}{L_y}.$$

It follows therefrom that $$\overline{G}_y = 2 \overline{G}_x \frac{L_x}{L_y} \tag{14}$$

(b) for a sinusoidal gradient:

$$2\pi = \gamma \cdot G_x \cdot L_x \cdot t_m = \int_0^{\frac{1}{2}} \gamma \cdot \overline{G}_y L_y \sin(2\pi t') dt'$$

in which $t' = t/t_m$

It follows therefrom that $$\overline{G}_y = \pi \cdot G_x \cdot \frac{L_x}{L_y} \tag{15}$$

(c) analogously, for a sawtooth or a "triangular" function:

$$\overline{G}_y = 4 \cdot G_x \cdot \frac{L_x}{L_y}. \tag{16}$$

However, it is to be noted that, because the gradient fields are usually generated by means of coils, use is preferably made of sinusoidally alternating gradients. The other types of periodically varying gradients exhibit acute transitions which impose practical problems when coils are used.

Figure 4:
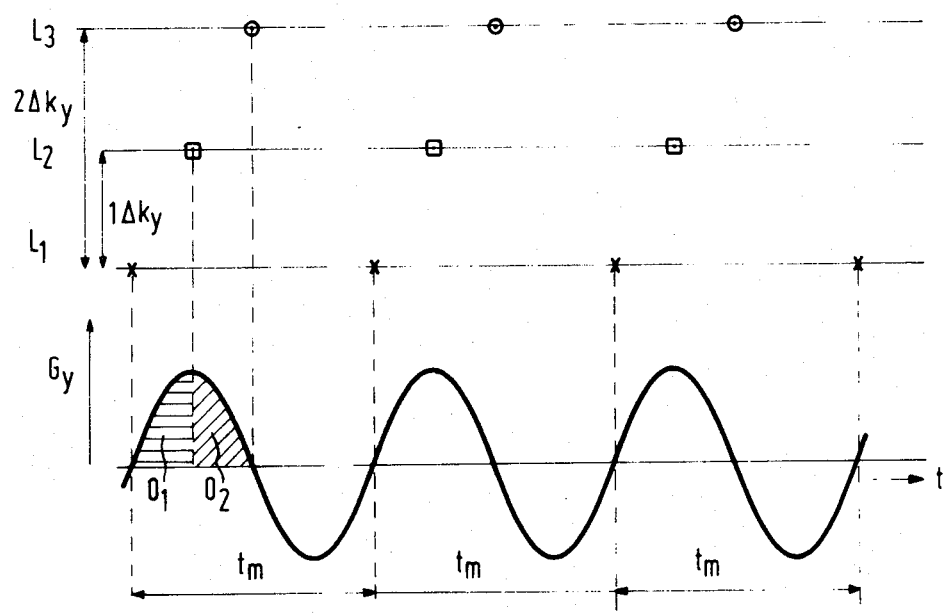
FIG. 4 shows a further version of a method in accordance with the invention.

The method in accordance with the invention, however, is not restricted to the measurement of one line in addition to the reference line L1. The method also enables the simultaneous measurement of more than two lines. FIG. 4 illustrates the case in which three lines (L$_1$, L$_2$, L$_3$) are simultaneously measured. The requirements imposed are again analogous to the requirements imposed in the above case concerning the simultaneous measurement of two lines, i.e. as regards the cancellation of the applied additional phase coding as well as regards the amplitude of $G_y$. Thus, for the simultaneous measurement of M lines (M > 1) with a stationary gradient $G_x$ and a gradient $G_y$ which varies in time, the amplitude $\overline{G}_y$, (a) must be given for a square wave gradient by $$\overline{G}_y = 2(M - 1)G_x \cdot \frac{L_x}{L_y} \tag{17}$$

(b) must be given for a sinusoidal gradient by $$\overline{G}_y = (m-1)\pi G_x \cdot \frac{L_x}{L_y} \quad (18)$$

Figure 5:
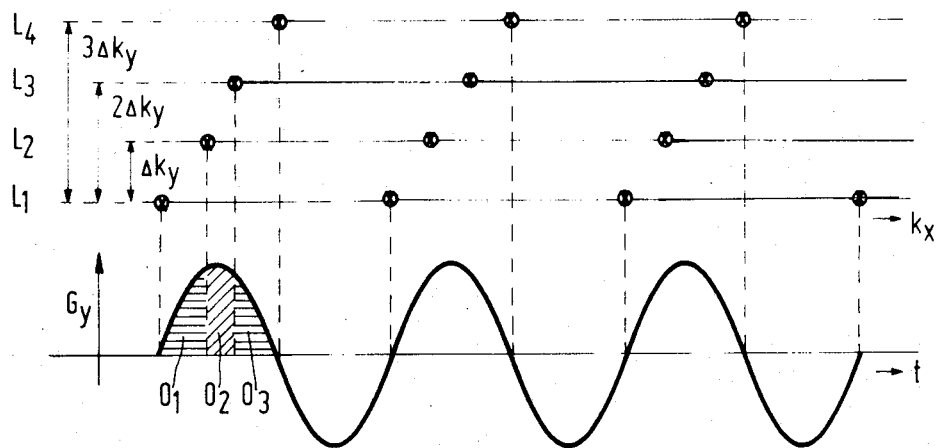
FIG. 5 shows the instants at which sampling must take place for a sinusoidal gradient and the lines to be measured.

The spacing between the various lines should again amount to $\Delta k_y$. The distance between a sampling point and the reference line is proportional to the surface enclosed by $G_y$, taken from the beginning of the sampling interval until the instant at which the sampling operation is performed. This is illustrated in FIG. 5 for the case involving three simultaneously measured lines and a sinusoidal alternating gradient. Therefore, in FIG. 5 $\Delta k_y$ must be proportional to $O_1$ and $2\Delta k_y$ must be proportional to $O_1+O_2$, and $3\Delta k_y$ must be proportional to $O_1+O_2+O_3$. This requirement has consequences as regards the instants $t_i$ at which the points on the various lines $L_i$ are measured.

Assume that M ($M<N_y$ and $M>1$) lines are simultaneously measured, so that an $N_x \times M$ matrix is determined. The distance between the $i^{th}$ line ($i=1, 2, \ldots M$) and the reference line should preferably amount to $(i-1)\Delta k_y$.

The distance $d(L_1, L_i)$ is related to the surface area which is described by the gradient during the time elapsed between the beginning of the sampling interval and the instant of a measurement on a non-reference line $L_i$. For a sinusoidally varying gradient field yields $$d = \int_0^{t_i'} \gamma \cdot \overline{G}_y \sin(2\pi t')dt'$$

wherein $t'=t/t_m$ and $t_i=t_i/t_m$ is the sampling interval on a reference line. Because a sample of the $M^{th}$ line is taken at the moment $t_M=t_m/2$ it can be deduced that:

$$\frac{d(L_1, L_i)}{d(L_1, L_M)} = \frac{\int_0^{t_i'} \sin(2\pi t')dt'}{\int_0^{\frac{1}{2}} \sin(2\pi t')dt'}$$

It follows therefrom that $$\frac{d(L_1, L_i)}{d(L_1, L_M)} = \frac{1 - \cos(2\pi t_i/t_m)}{2} \quad (19)$$

and on the other hand that $$\frac{d(L_1, L_i)}{d(L_1, L_M)} = \frac{i-1}{M-1} \quad (20)$$

From the expressions (19) and (20) it follows that:

$$\cos\left(\frac{2\pi t_i}{t_m}\right) = 1 - \frac{2(i-1)}{(M-1)} \quad (21)$$

or $$t_i = \frac{t_m}{2\pi} \cdot \arccos\left[1 - \frac{2(i-1)}{(M-1)}\right]$$

Substitiution of values for M and the associated value of i in the expression (22) reveals that if $M \leq 3$, sampling can be performed equidistantly in time. For $M>3$, the requirement of expression (21) results in sampling which is not equidistant in time. This can be simply illustrated on the basis of the example $M=4$, $i=1, 2, 3, 4$.

| i | $\cos(2\pi t_i/t_m)$ | $t_i/t_m$ |
|---|---|---|
| 1 | 1 | 0 |
| 2 | ⅓ | 0.19 |
| 3 | −⅓ | 0.30 |
| 4 | −1 | 0.50 |

These points are shwon in FIG. 5.

For a squarewave gradient, the measuring points are equidistant for each value of M, because $\overline{G}_y$ has a constant value through the half period.

$$t_i = \frac{t_m}{2} \cdot \frac{i-1}{M-1} \quad (23)$$

The same requirement as regards the linear increase of the surface area from one sampling operation to another is of course also applicable to a sawtooth alternating gradient $\overline{G}_y$ where the sampling is no longer equidistant for values of M larger than 2.

Analogous to the foregoing description, it can be deduced for a sawtooth alternating gradient magnetic field that $$\frac{t_i}{t_m} = \frac{1}{2} \cdot \sqrt{\frac{i-1}{M-1}}$$

For the purpose of illustration, the cases $M=3$ and $M=4$ will be considered for a sawtooth alterniatng gradient $G_y$.

| (a) M = 3 | | (b) M = 4 | |
|---|---|---|---|
| i | $t_i/t_m$ | i | $t_i/t_m$ |
| 1 | 0 | 1 | 0 |
| 2 | 0.35 | 2 | 0.29 |
| 3 | 0.50 | 3 | 0.41 |
| | | 4 | 0.50 |

For a sawtooth alternating gradient $G_y$, it is then applicable that the sampling is not equidistant for $M \geq 3$. It will be clear that each periodic function is satisfactory for Gy and that for each periodic function the sampling points must preferably be chosen so that the surface enclosed during the first half period by two successive sampling points is a linear function of time.

Therefore, it is important to carry out the sampling operations which are performed on the non-reference lines at the correct instants $t_i$ which are given by the above relations. In order to achieve this object, the device for performing a method in accordance with the invention comprises a control unit (37 in FIG. 2) for controlling the sampling operations at the correct instants $t_i$.

Regarding the amplitude of $G_y$, it may be stated in general that for the simultaneous measurement of M lines the following is applicable:

$$\tau + \int_\tau^{t_m/2} \gamma \cdot G_y(t')dt' = (M-1) \Delta k_y = (M-1) \cdot \frac{2\pi}{L_y}$$

(Therein, $\tau$ is the instant at which a sampling operation is performed on the reference line).

In other words: at the instant which is exactly situated between the samples on a reference line, $(M-1)\Delta k_y$ must be bridged for simultaneous measurement of M lines. This is no longer generally applicable when use is made of functions $G_y(t)$ which are not anti-symmetrical in their zero points. These shapes will be ignored in view of their lack of practical importance.

In total, $N_y$ lines must be measured for a $N_x \times N_y$ matrix in the $(k_x, k_y)$ space. When a divider of $N_y$ is chosen for M, the image is defined in $N_y/M$ measurements. Thus, during the first measurement information is collected on the lines 1 to M, during the second measurement on the lines $M+1$ to $2M$ etc. When the information is to be collected on the lines m to $m+M-1$, such a $G_y$ is applied before the sampling that:

$$\int_0^t \gamma \cdot G_y(t') \, dt'$$

is the ky value of the $m^{th}$ line (t is the instant just before the sampling commences).

In accordance with the proposed method, the image is reconstructed as follows. It appears from the foregoing description that for the simultaneous measurement of M lines, the samples must be divided among the M lines in the $(k_x, k_y)$ space. When M is again a divider of $N_y$, this is done for all $N_y/M$ measurements. It is to be noted that the samples on the $N_y - N_y/M$ "non-reference" lines are still in a shift position with respect to the samples on the $N_y/M$ reference lines except for the case wherein use is made of a gradient field $G_x$ as shown in FIG. 3a. In order to ensure that on each row the correct sample is obtained for the Fourier transformation along ky (Fourier transformation of columns), it is necessary to find for the "non-reference" lines the intermediate points which have the same $k_x$ coordinate as the points on the reference lines. This can be achieved by interpolation via Fourier transformation. This is done as follows: take the data of a "non-reference" line, perform a 1-D Fourier transformation on these data, supplement zeros at the left and the right, and perform a 1-D Fourier back-transformation. The number of zeros added depends on the shift of the sample points on the relevant line with respect to those on the reference line. Subsequently, a 2-D Fourier transformation is required in order to obtain the actual image.

Another possibility is to perform, after the Fourier transformation along $k_x$ (which must be performed in the 2-D Fourier transformation process), a phase rotation on the values associated with the line $(x, k_y)$, that is to say so that the rotation is proportional to x. The proportionality constant in its turn is proportional again to the degree of shifting of the points prior to the Fourier transformation with respect to those on a reference line. By subsequently performing another Fourier transformation along $k_y$ on the information thus treated, the pursued actual image will be found.

The imaging of a 3-D object will now briefly be described. The data are collected in the 3-D Fourier transformed space having the coordinates $k_x, k_y, k_z$. In the 3-D mode of the Fourier transformation, the signal is again measured in the presence of one of the gradients, for example $G_x$. During measurement data are now collected on a line in the Fourier transformed $(k_x, k_y, k_z)$ space which extends parallel to the $k_x$ axis. The ky value and the $k_z$ value associated with these lines are determined by the surface below the gradients $G_y$ and $G_z$, respectively, applied before sampling. Simultaneous measurement of several lines parallel to the $k_x$ axis is again possible. This may concern lines having the same $k_z$ coordinates or the same $k_y$ coordinates. In the former case a gradient $G_y$ which alternates in time is present during the measurement of the signal, in addition to a constant gradient $G_x$, while in the second case $G_z$ is the gradient which varies in time. It should be noted that also in the 3-D case a gradient field $G_x$ as shown in FIG. 3a can be used. The further reconstruction of the image is completely analogous to that in the 2-D mode.

For imaging a 1-D, 2-D, 3-D distribution of nuclear spin resonance spectra (a 1-DF, 2-DF, 3-DF) one, two or three gradient fields are applied during the preparation period for selecting e.g. the $k_x$ or $k_x$ and $k_y$, or $k_x$, $k_y$, $k_z$ image frequencies. During the measuring time a number of sampled signals are taken, which are stored in the time $(t-)$ columns of the $(k_x,t)$, $(k_x, k_y, t)$, $(k_x, k_y, k_z, t)$ matrix. By applying an additional gradient field and by taking at least one (two, three ...) additional sampled signal during each period of the additional (periodic alternating) gradient field at least two (three, four, ...) columns of a matrix will be filled during a single measuring period e.g. the columns $(k_x, t)$ and $(k_x + \Delta k_x, t)$, $(k_x, k_y, t)$ and $(k_x, k_y + \Delta k_y, t)$, $(k_x, k_y, k_z, t)$ and $(k_x, k_y, +\Delta k_y, k_z, t)$ are filled. As a result the total time for forming a distribution of nuclear spin resonance spectra will be reduced to 50% (33-½%, 25% ....).

Although in the previous example no gradient field (steady gradient field) has been applied during the measuring period, the method according to the invention works as well if (e.g. in the 3-D case) during the preparation period two gradient fields are applied, if during the measuring period the third gradient field is applied, and if during the preparation time a different time lapse between excitation and application of the two gradient fields is chosen each time. Then each time columns $(k_x, k_y, t)$ and $(k_x + \Delta k_x, k_y t) \ldots$ etc. of the matrix are filled along the coordinate (frequency -) axis $k_z$.

Figure 3B:
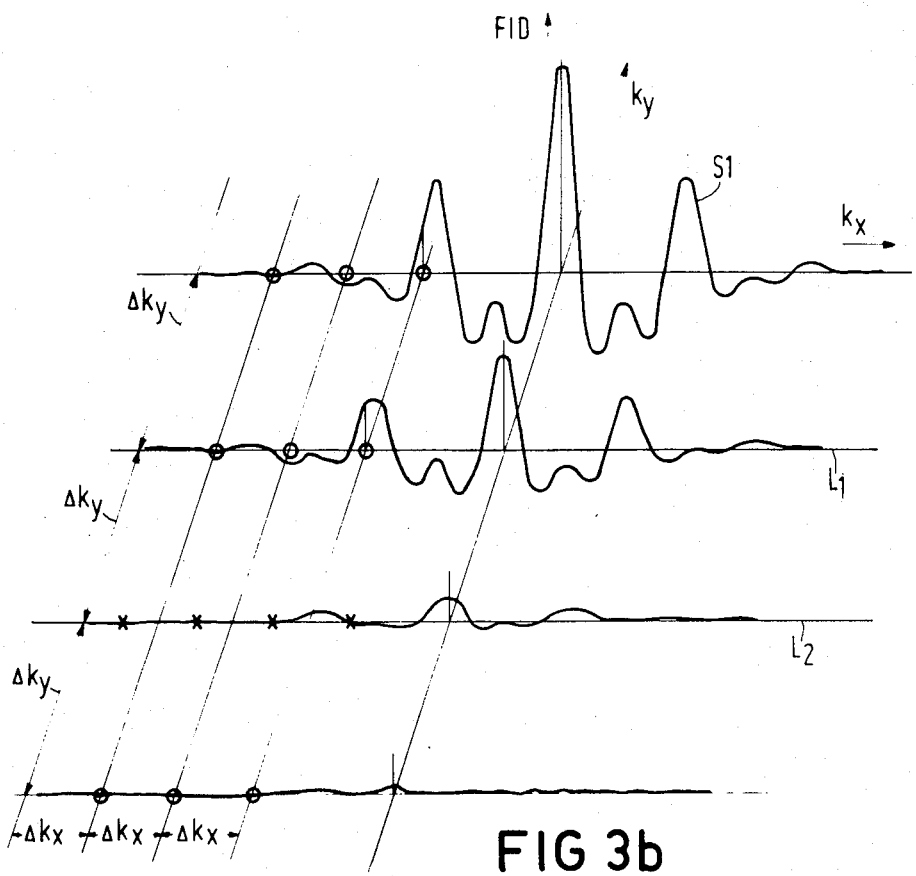
Figure 6:
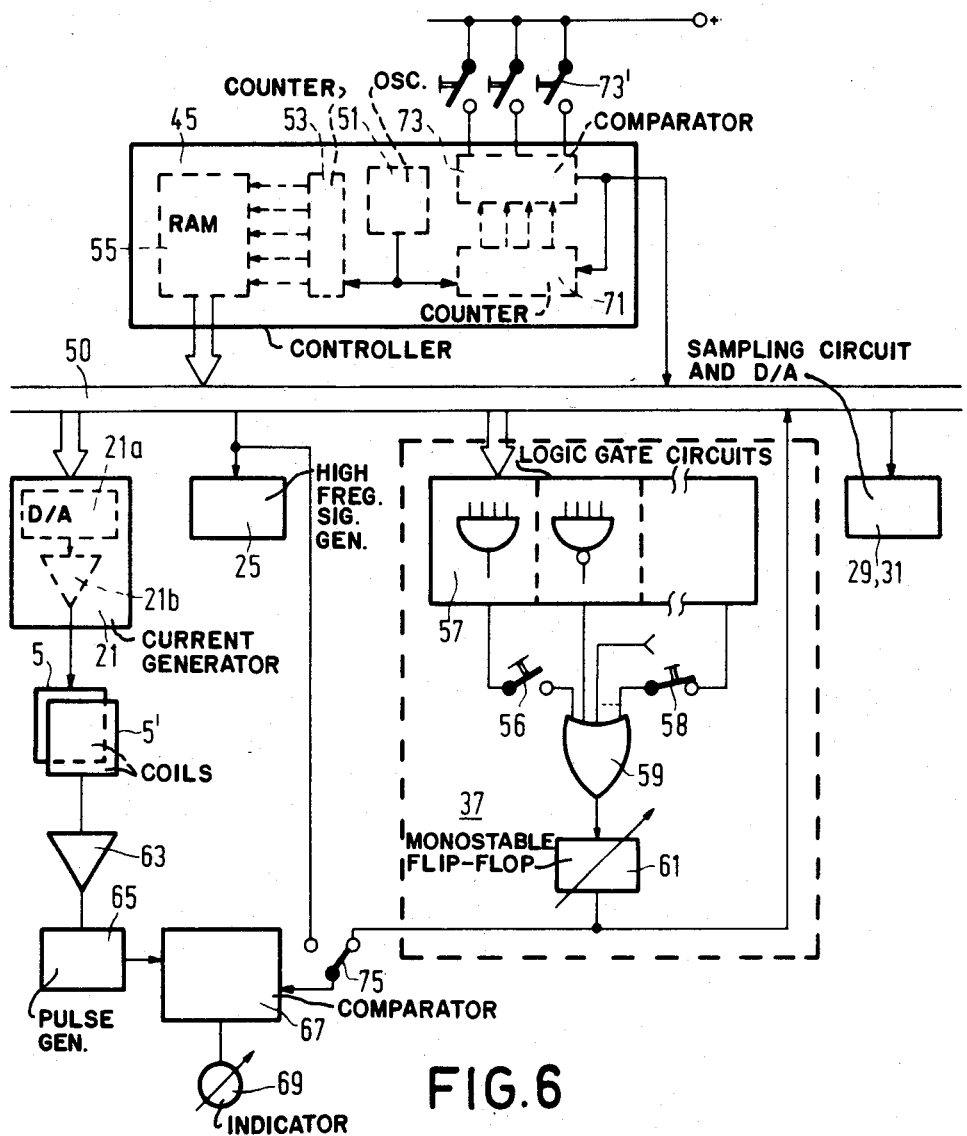
FIG. 6 shows a further embodiment of a part of the device in accordance with the invention.

As appears from FIGS. 3a and 3b, it is useful to make the sampling instants denoted by 0 and x coincide with the zero points of the curve $G_3$ and $G_4$ (reversal of the gradient direction of the gradient magnetic field $G_y$). It is also useful to perform a sampling operation at the instant $t_o$ at which the spin echo occurs (this because $k_x = 0$ in that case). Consequently, FIG. 6 diagrammatically shows means for synchronizing the signals. This time modulated gradient magnetic field $G_y$ is generated as follows. The central control means 45 comprise at least one oscillator 51 and a counter 53, the input of which is connected to the oscillator 51 while the outputs are connected to the address inputs of a random access memory (RAM) 55. The successive counter positions produce binary control signals on the outputs of the memory 55 which form the amplitudes of a sinusoidal signal. By a bus 50, the binary numbers of the memory 55 are applied to the generator 21 which comprises a D/A converter 21a and an amplifier 21b for generating a sinusoidally modulated gradient magnetic field Gy. The control signals are also presented to the control unit 37. The control unit 37 comprises some logic gate circuits 57 which give an output pulse in response to given binary numerical combinations (for example, 0000=zero crossing or 1111=maximum amplitude) with the pulse being presented to an adjustable monostable flip-flop 61, via an OR-gate 59, and the output of the flip-flop being connected to the sampling means (29 and 31) via the bus 50. The purpose of the adjustable flip-flop 61 will be described hereinafter.

There are also provided detection means for detecting the reversals of the gradient direction of the $G_y$ field. These means comprise a coil 5' which encloses (a part of) the Gy field. The coil 5' may form part of the coils 5. The signal which is generated in the coil 5' by the gradient magnetic field which varies in time is applied to an amplifier 63 in order to be amplified and applied to a pulse generator 65 (for example, a Schmitt-trigger circuit). The pulses formed by the pulse generator 65 are a measure for the instants at which the gradient direction of the $G_y$ field is reversed and are applied to a comparison circuit 67 which also receives the pulses from the flip-flop 61. The comparison circuit 67 enables determination of the time difference between the occurrence of a sampling pulse (61-29, 31) and the instant of reversal of the gradient direction (5', 63) with the time difference being displayed by means of an indicator 69. The comparison circuit 67 and the indicator 69, for example, form part of a two-channel oscilloscope, but may alternatively be a set-reset flip-flop and a pulse duration measuring device, respectively with the outputs of the pulse generator 65 and the flipflop 61 being connected to the inputs of the set-reset flipflop, and the pulse duration measuring device being connected to the output thereof. The pulse duration of a pulse to be generated by the monostable flipflop 61 can be adjusted on the basis of the time difference thus measured, so that the sampling instant can be advanced or delayed. The delays or phase shifts, which occur unavoidably in any circuit, pass by the signals to be compared and the control signals must also be taken into account. For effectively determining the time difference it is useful to admit to the OR-gate 59 only pulses of the logic circuit 57 which generates a pulse in response to the binary number combination (for example, 0000) which represents the zero crossing of the generated sinusoidal signal.

In order to make the spin-echo instant coincident with a sampling instant, the control means 45 comprise a further counter 71, connected to the oscillator 51, and a comparator 73 which can be adjusted by means of switches 73'. When the counter 71 reaches a position which corresponds to the value adjusted in the comparator 73, it outputs a pulse which resets the counter 71 to a starting position and which activates, via the bus 50, the high-frequency generator 25 in order to supply a 90° pulse or a 180° pulse (which pulse is to be generated can be determined via a control signal not elaborated herein). When a 180° pulse is supplied, the spin-echo instant will have been reached when the counter 71 reaches the value adjusted to in the comparator 73 ($t_{v1}=t_{v2}$, see FIG. 3a) with the comparator 73 then again supplying a pulse which is also applied to the comparison circuit 67 via a switch 75. Thus, the smallest time difference can be determined between a reversal of the gradient direction (with which the sampling instants should coincide) and the spin-echo instant. The spin-echo instant can be adjusted (advanced or delayed) by changing the value adjusted in the comparator by an amount which equals half the time difference, multiplied by the oscillator frequency (by varying $t_{v1}$ as well as $t_{v2}$!) so that sampling instants and the occurrence of spin-echo can be synchronized.

Even though the control means 45, the control unit 37, and the further means for the synchronization of the occurrence of various signals have been described on the basis of discrete circuits, the same result can also be obtained without difficulty by utilizing a microprocessor which completes a preprogrammed timing schedule adapted, if necessary, to changing operating conditions by utilizing the signals obtained by means of the coil 5' and the amplifier 63.

In order to render the number of samples per sampling interval tm adjustable (see FIGS. 4 and 5), outputs of various logic gates of the circuit 57 are connected to an input of the OR-gate 59 via a switch 56, 58. A sampling operation can be performed at a given amplitude of the sinusoidal signal by the opening or closing of the switches 56, 58. If the duration of a sampling interval tm is to be longer or shorter, it will merely be necessary to adapt the frequency of the oscillator 51; the relative sampling instants $t_i$ within the sampling interval tm will not be disturbed thereby.

What is claimed is:

1. A method for determining a nuclear magnetization distribution in a part of a body which is situated in a stationary, homogeneous magnetic field which is generated in a first direction, said method comprising the steps of: (a) generating a high-frequency electromagnetic pulse in order to cause a precessional motion of the magnetization of nuclei in the body around a first field direction so as to generate a resonance signal (b) applying at least one gradient magnetic field during a preparation period (c) applying a further gradient field during a measuring period, said measuring period being divided into a number of sampling intervals of substantially equal duration, (d) periodically extracting n sample signals from the resonance signal during said sampling intervals, and (e) repeating a measurement cycle, comprised of the steps (a), (b), (c) and (d), n' times, wherein an integral of the intensity of at least one gradient field over the preparation period has a different value during successive measurement cycles in order to obtain a group of sample signals wherefrom, after Fourier transformation thereof, an image of the distribution of the induced nuclear magnetization is determined, characterized in that during said measuring period an additional gradient magnetic field is generated having a gradient direction corresponding to the gradient direction of said gradient magnetic field generated during said preparation period, said additional gradient magnetic field being periodic in time and having a period equal to said sampling interval, wherein the effect exerted on the nuclear magnetization by said additonal gradient magnetic field integrated over a sampling interval is zero, and wherein at least one additional sampling operation is performed after the beginning and before the end of each sampling interval.

2. A method as claimed in claim 1, wherein at the beginning and during each sampling interval the gradient direction of said additional gradient magnetic field is reversed, and sampling operations are performed at least virtually at the instants of reversal of said gradient direction.

3. A method as claimed in claim 2, wherein during each sampling interval at least one further sampling operation is performed between the instants of reversal of said gradient direction of said additional gradient magnetic field, said gradient direction of said additional gradient magnetic field being the same at each further sampling operation.

4. A method as claimed in clam 3, wherein, during each sampling interval, M sampling operations are always performed, and wherein said measurement cycle is repeated m/M times in order to determine a local nuclear magnetization in n×m image points, said points n and m/N being positive integer numbers, and m>M≧2.

5. A method as claimed in claim 1, 2, 3, or 4, wherein during said preparation period two gradient magnetic fields are applied having gradient directions perpendicular to one another, and wherein said measurement cycle is repeated 1×m/M times with M sampling operations being performed in each sampling interval in order to determine, via a 3-dimensional Fourier transformation, local nuclear magnetization spectra at the 1×mxn points in a 3-dimensional part of a body, at least one of 1/M, m/M, and M being positive integer numbers larger than 1.

6. A method as claimed in claim 1, 2, 3, or 4, wherein said additional gradient field is squarewave modulated in time, and wherein said sampling instants within a sampling interval are equidistant in time.

7. A method as claimed in claim 1, 2, 3, or 4, wherein said additional gradient magnetic field is sinusoidally modulated with a period coinciding with said sampling interval, and wherein said sampling instants $t_i$ are determined by:

$$t_i = t_m/2 \cdot \arccos\left[1 - \frac{2(i-1)}{(M-1)}\right]$$

in which:
 $t_i$ is the $i^{th}$ sampling instant,
 $t_m$ is the sampling interval,
 i is a natural number smaller than (m+1) and larger than or equal to 2, and
 M is a natural number.

8. A method as claimed in claim 1, 2, 3, or 4, wherein said additional gradient magnetic field is periodic in time and has a period which equals said sampling interval with a gradient direction always being the same, said additional gradient magnetic field being zero during a part of said sampling interval, and said sampling operations being performed during said part.

9. A method of determining a nuclear magnetization spectra distribution in a part of a body which is situated in a stationary, homogeneous magnetic field which is generated in a first direction, said method comprising the steps of: (a) generating a high-frequency electromagnetic pulse in order to cause a precessional motion of the magnetization of nuclei in the body around the first field direction so as to generate a resonance signal; (b) applying at least one gradient magnetic field during a preparation period, (c) taking, during a measuring period, n sample signals from said resonance signal, said measuring period being divided into a number of sampling intervals of substantially equal duration for periodic extraction of said n sample signals; and (d) then repeating a measurement cycle comprised of said steps (a), (b) and (c) n' times, wherein an integral of the intensity of at least one gradient field over said preparation period has a different value during successive measurement cycles in order to obtain a group of sample signals wherefrom, after Fourier transformation thereof, an image of the distribution of the induced nuclear magnetization spectra is determined, characterized in that during said measuring period an additional gradient magnetic field is generated having a gradient direction corresponding to the gradient direction of said gradient magnetic field generated during said preparation period, said additional gradient magnetic field being periodic in time and having a period equal to said sampling interval, wherein the effect exerted on the nuclear magnetization by said additional gradient magnetic field integrated over a sampling interval is zero, and wherein at least one additional sampling operation is performed after the beginning and before the end of each sampling interval.

10. A method as claimed in claim 9, wherein at the beginning and during each sampling interval the gradient direction of said additional gradient magnetic field is reversed, and sampling operations are performed at least virtually at the instants of reversal of said gradient direction.

11. A method as claimed in claim 10, wherein during each sampling interval at least one further sampling operation is performed between the instants of reversal of said gradient direction of said additional gradient magnetic field, said gradient direction of said additional gradient magnetic field being the same at each further sampling operation.

12. A method as claimed in claim 11, wherein during each sampling interval M sampling operations are always performed, and wherein said measurement cycle is repeated m/M times in order to determine a local nuclear magnetization in n×m image points, said points n and m/N being positive integer numbers, and m>M≧2.

13. A method as claimed in claim 9, wherein during said preparation period two gradient magnetic fields are applied having gradient directions perpendicular to one another, and wherein said measurement cycle is repeated 1×m/M times with M sampling operations being performed in each sampling interval in order to determine, via a 3-dimensional Fourier transformation, local nuclear magnetization spectra at the 1×m×n points in a 3-dimensional part of a body, at least one of 1/M, m/M, and M being positive integer numbers larger than 1.

14. A method as claimed in claim 9, wherein said additional gradient field is squarewave modulated in time, and wherein said sampling instants within a sampling interval are equidistant in time.

15. A method as claimed in claim 9, wherein said additional gradient magnetic field is sinusoidally modulated with a period coinciding with said sampling interval, and wherein said sampling instants $t_i$ are determined by:

$$t_i = t_m/2 \cdot \arccos\left[1 - \frac{2(i-1)}{(M-1)}\right]$$

in which:
 $t_i$ is the $i^{th}$ sampling instant,
 $t_m$ is the sampling interval,
 i is a natural number smaller than (m+1) and larger than or equal to 2, and
 M is a natural number.

16. A method as claimed in claim 9, wherein said additional gradient magnetic field is periodic in time and has a period which equals said sampling interval with a gradient direction always being the same, said additional gradient magnetic field being zero during a part of said sampling interval, and said sampling operations being performed during said part.

17. A device for determining the nuclear magnetization spectra distribution in a part of a body, said device comprising:
  (a) first means for generating a stationary homogeneous magnetic field,
  (b) second means for generating high-frequency electromagnetic radiation so as to cause processional motion of the magnetization of nuclei in the body disposed in said stationary magnetic field and thereby produce a resonance signal,
  (c) third means for generating at least one gradient magnetic field so as to condition said resonance signal during a preparation period,
  (d) sampling means for sampling said resonance signal, after conditioning with said at least one gradient magnetic field, said resonance signal being sampled by said sampling means during a plurality of sampling intervals of substantially equal duration so as to obtain a number of sample signals,
  (e) processing means for processing said sample signals supplied by said sampling means, and control means for controlling at least said first means, second means, third means, sampling means and processing means so as to generate, condition, sample and process a plurality of said resonance signals during successive mesurement cycles, said
  (f) control means suppling said third means with control signals for adjustment of intensity and/or duration of said at least one gradient magnetic field so that an integral of intensity over the duration of said at least one gradient magnetic field is different during successive measurement cycles, characterized in that during sampling, said control means applies further control signals to said third means in order to generate an additional gradient magnetic field which periodically varies in time and whose period equals said sampling interval, wherein at the end of each sampling interval the effect exerted by said additional gradient magnetic field on the nuclear magnetization integrated over a sampling interval is zero, and wherein said control means applies said further control signals to said sampling means in order to sample the resonance signal at least once after the beginning and before the end of said sampling interval.

18. A device as claimed in claim 17 further comprising detection means for detecting reversals of the gradient direction of said additional gradient magnetic field and a control unit responsive to said detection means for supplying pulses at sampling instants, said instants of said pulses supplied by said control unit being adjustable by means of a signal generated by said detection means in order to synchronize sampling instants at which said resonance signal is sampled with said additional gradient field.

19. A device as claimed in claim 18, wherein a nuclear spin resonance echo technique is performed, and wherein said detection means supplies said processing means with pulses which have been determined by detection of instants of reversal of said gradient direction for determining the time difference between the instant of spin echo and an instant at which the gradient direction is reversed and for correcting the period of time between a 90° pulse and a 180° pulse by half the time difference.

20. A device as claimed in claim 18, wherein said control means comprise an oscillator, a pulse counter, a digital memory and logic gate circuits whereby an output of said oscillator is connected to an input of said pulse counter having multiple outputs connected to an address input of said memory, wherein a sine wave function has been stored in said memory to feed a digital output signal to a generator for generating a sine-wave modulated magnetic gradient field, said digital output signal being fed to inputs of each of a plurality of said logic gate circuits, and wherein an output of each of said logic gate circuits is connected to an input of a logic OR gate, said logic OR gate having an output controlling said sampling means, and each of said logic gate circuits generating an output signal for a different digital output signal of said memory.

21. A device as claimed in claim 17 comprising means for detecting reversals of the gradient direction of said additional gradient magnetic field and means responsive to said detecting means for synchronizing said sampling means so that said resonance signal is sampled in synchronism with said additional gradient field.

22. A device as claimed in claim 21 wherein said additional gradient field is squarewave modulated in time.

23. A device as claimed in claim 21 wherein said additional gradient field is sinusoidally modulated with a period coinciding with said sampling interval.

* * * * *

UNITED STATES PATENT AND TRADEMARK OFFICE
CERTIFICATE OF CORRECTION

PATENT NO.    : 4,691,162
DATED         : September 1, 1987
INVENTOR(S)   : Cornelis M.J. van Uijen It is certified that error appears in the above-identified patent and that said Letters Patent is hereby corrected as shown below:

IN THE CLAIMS

Claim 17, line 21     delete "control"

line 22     before "means" (first occurrence)

insert --(f) control-- line 27     delete "(f)"

Signed and Sealed this

Fifteenth Day of November, 1988

*Attest:*

DONALD J. QUIGG

*Attesting Officer*     *Commissioner of Patents and Trademarks*